US005892347A

United States Patent [19]
Zweighaft et al.

[11] Patent Number: 5,892,347
[45] Date of Patent: Apr. 6, 1999

[54] TAPE DRIVE WITH HIGH PERFORMANCE GAIN AMPLIFIER USING RADIO FREQUENCY DIELECTRIC HEATING

[75] Inventors: James Zweighaft, Boulder; Dallas Baumann, Berthoud, both of Colo.

[73] Assignee: Exabyte Corporation, Boulder, Colo.

[21] Appl. No.: 546,838

[22] Filed: Oct. 23, 1995

Related U.S. Application Data

[63] Continuation of Ser. No. 150,731, Nov. 12, 1993, abandoned.

[51] Int. Cl.⁶ ................................................ G05B 11/18
[52] U.S. Cl. ........................... 318/590; 318/254; 318/677; 388/811; 388/910; 360/73.03; 360/74.1
[58] Field of Search ..................................... 318/561, 254, 318/491, 590–596, 671, 677, 687; 388/800–841, 910; 360/71, 73.01, 74.7

[56] References Cited

U.S. PATENT DOCUMENTS

| | | | |
|---|---|---|---|
| Re. 34,399 | 10/1993 | Gami et al. | 360/73.01 |
| 3,665,500 | 5/1972 | Lewis et al. | 318/596 |
| 3,893,012 | 7/1975 | Lin | 318/696 |
| 4,125,881 | 11/1978 | Eige et al. | 360/50 |
| 4,835,628 | 5/1989 | Hinz et al. | 360/48 |
| 4,839,754 | 6/1989 | Gami et al. | 360/73.01 |
| 4,843,495 | 6/1989 | Georgis et al. | 360/70 |
| 5,065,261 | 11/1991 | Hughes et al. | 360/70 |
| 5,068,757 | 11/1991 | Hughes et al. | 360/77.13 |
| 5,142,422 | 8/1992 | Zook et al. | 360/54 |
| 5,191,491 | 3/1993 | Zweighaft | 360/77.13 |
| 5,204,593 | 4/1993 | Ueki | 318/254 |
| 5,289,097 | 2/1994 | Erickson et al. | 318/561 |

*Primary Examiner*—David S. Martin
*Attorney, Agent, or Firm*—Nixon & Vanderhye, P.C.

[57] ABSTRACT

A power amplifier (18) for driving a brushless DC motor (22) includes a processor (40) which receives a signal indicative of motor situational usage and generates a mode state signal indicative of which one of a plurality of amplification modes is to be implemented in response to the received signal. The amplification modes include a linear mode and a switching mode, with the switching mode including a two quadrant switching mode and a four quadrant switching mode. The amplifier (18) further includes a controller (50) which, in response to the mode state signal, generates control signals for each of coil drive circuits (26) associated with the motor. Further, in response to a signal indicative of motor situational usage, processor (40) generates a power state signal which causes controller (50) to connect coil drive circuits (26) to a suitable one of a plurality of differing voltage sources (21, 23). The power amplifier (18) has particular employment for a reel motor (22S, 22T) for a helical scan recorder (100) which records information on magnetic tape (102).

3 Claims, 3 Drawing Sheets

TAPE DRIVE WITH HIGH PERFORMANCE GAIN AMPLIFIER USING RADIO FREQUENCY DIELECTRIC HEATING

This is a continuation of application Ser. No. 08/150,731, filed Nov. 12, 1993, now abandoned.

BACKGROUND

1. Field of Invention

This invention pertains to an amplifier capable of different operating modes and different power supply voltages, and particular to an amplifier for a brushless DC motor.

2. Related Art and Other Considerations

Motor amplifiers are generally designed to operate in only one of a plurality of different modes. Some amplifiers operate in a linear mode; other amplifiers operate in a switching mode. Switching mode amplifiers can further be classified as either two quadrant switching or four quadrant switching. As is well known in the art, each mode is useful under certain circumstances, but has drawbacks that make use thereof less desirable in other circumstances.

Consider a motor driven by bridge transistors, such as a brushless three-phase DC motor, for example. Motor rotation is achieved by commutation, i.e., selectively turning on and off coils in the motor using transistors in the bridge.

Linear mode operation generates the least electronic noise, owing to the absence of switching except at relatively infrequent commutation boundaries. The only switching action occurs when an active coil pair needs to be change to a different pair as the motor rotates. The disadvantage with linear mode operation is that power dissipation can be quite high, resulting in undesirable heating.

Switching mode operation involves switching the bridge transistors on and off at an extremely fast rate (on the order of one hundred thousand times per second). This so-called "chopping" action occurs much faster (typically one hundred times faster) than the commutation activity. The advantage of the switching mode is much lower power dissipation in the amplifier. The disadvantage is increased electronic noise generated by the rapid switching activity.

A certain method of selecting which bridge transistors are turned on and off is known as two quadrant switching mode. In order to make current build up in two of the motor's coils, one upper and one lower transistor are turned on. Due to the inductive nature of the coils, current builds up at a relative slow rate. Typically before the current has reached its maximum (i.e., saturation) value, one of the two transistors is turned off. If the motor speed is not excessive, the current will then "flyback" through one of the diodes associated with the transistor that was just turned off, and flow in a circular path as it slowly decays. By adjusting the ratio of "on" (two transistors on) and "off" (only one transistor on), an average level of motor current can be achieved. The percentage "on" time (on/(on+off)) is called the duty cycle. The small amount (compared with its average value) that the current increases and decreases is called "ripple".

Two quadrant switching works well in cases where motor speed is low and the desired direction of current matches the motor direction. It has the advantage of a relatively slow decay rate of the current during the "off" time, resulting in low current ripple (i.e., the current is relatively constant). However, if rapid deceleration of the motor from a high speed is required, the current in a two quadrant system may fail to decay during the "off" cycle, and in fact increase due to the effect of the motor's internally generated voltage. This results in a complete loss of control.

SUMMARY

A power amplifier for driving a brushless DC motor includes a processor which receives a signal indicative of motor situational usage and generates a mode state signal indicative of which one of a plurality of amplification modes is to be implemented in response to the received signal. The amplification modes include a linear mode and a switching mode, with the switching mode including a two quadrant switching mode and a four quadrant switching mode. The amplifier further includes a controller which, in response to the mode state signal, generates control signals for each of coil drive circuits associated with the motor. Further, in response to a signal indicative of motor situational usage, the processor generates a power state signal which causes the controller to connect the coil drive circuits to a suitable one of a plurality of differing voltage sources. The power amplifier has particular employment for a reel motor for a helical scan recorder which records information on magnetic tape.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
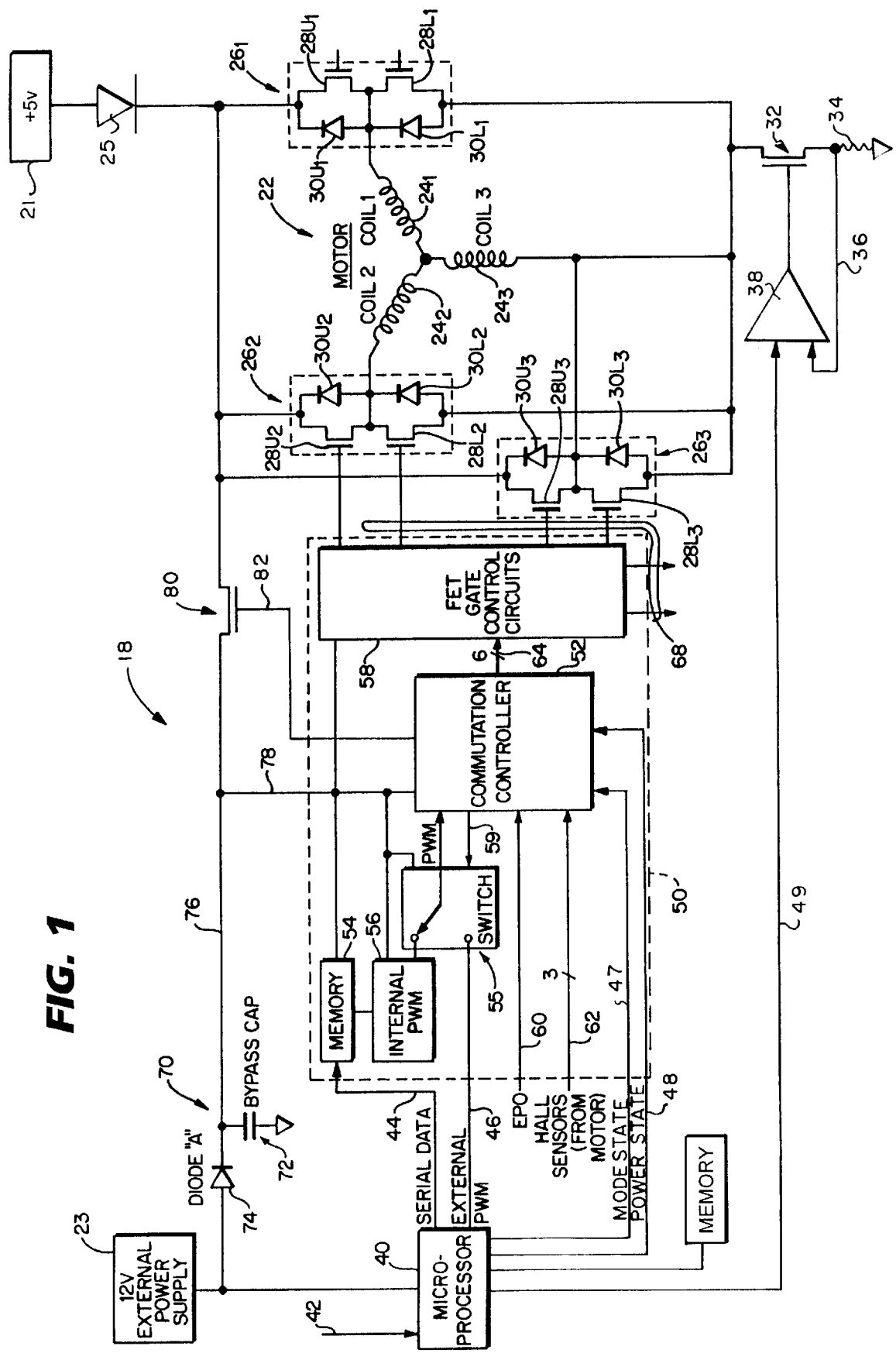
FIG. 1 is a schematic view of a power amplifier for a brushless DC motor according to an embodiment of the invention.

FIG. 1 shows a power amplifier 18 for a brushless DC motor 22. Motor 22 can be employed for any of innumerable purposes, one example of which being reel motor for a helical scan recorder as described below. Motor 22 is selectively powered by either +5 volt source 21 or 12 volt external power supply 23.

In the particular embodiment shown in FIG. 1, motor 22 is a three phase brushless DC motor having three coils $24_1$, $24_2$, and $24_3$. For each coil $24_1$, $24_2$, and $24_3$ there is provided a respective coil drive circuit $26_1$, $26_2$, and $26_3$. Each coil drive circuit 26 is connected between the two power supplies 23, 21 and ground. A diode 25 is connected between +5 voltage source 21 and the coil drive circuits 26.

Each coil drive circuit includes a pair of FET transistors 28U and 28L, as well as the FET's corresponding intrinsic diodes 30U and 30L. In each coil drive circuit 26, the transistor 28U and diode 30U are connected in parallel between the coil 24 and external power supply 23; transistor 28L and diode 30L are connected in parallel between the coil 24 and ground. Although not shown in FIG. 1, motor 22 is typically provided with a sensor (such as a Hall sensor) for each coil 24.

A current gate, notably FET 32, is connected between each coil drive circuit 26 and ground. Between FET 32 and ground there is connected a resistor 34 and a feed back line 36 leading to a first terminal of a current gate feedback control circuit 38.

Power amplifier 18 includes a microprocessor 40 which is powered by external power supply 23. Microprocessor 40 receives on input bus 42 signals indicative of a desired situational use for which motor 22 is to be employed. For example, in the context of a helical scan recorder wherein motor 22 rotates a reel of storage media such as magnetic tape, a first situational use might be a slow speed read of the tape; a second situational usage might be a high speed search of the tape; and so forth.

Microprocessor 40 has a serial data output port to which serial line 44 is connected; as well as a port to which a pulse width modulation (PWM) line 46 is connected. As explained in more detail in simultaneously-filed U.S. patent application Ser. No. 08/150,727 of James Zweighaft entitled "Power-Off Motor Deceleration Control System" (incorporated herein by reference), microprocessor 40 routinely outputs a contingent motor-governing deceleration signal on serial line 44 and outputs a normal motor-governing PWM control signal on line 46. Microprocessor 40 is also connected to access a memory (such as read only memory [ROM]) wherein (in one embodiment) table look-up information is stored.

Microprocessor 40 also generates three other output signals. These output signals are a (serial) mode_state signal on line 47; a (serial) power_state signal on line 48; and a current gate control signal on line 49. The current gate control signal on line 49 is applied to a second terminal of current gate feedback control circuit 38.

Power amplifier 18 also includes a state control circuit 50. State control circuit 50 includes a controller 52; a memory 54; a switch 55; PWM conversion circuit 56; and gate control circuitry 58 (for controlling gates of each of the transistors 28).

As shown in FIG. 1, an input port of memory 54 is connected to serial data line 44 for reception of the contingent motor-governing deceleration signal. An output port of memory 54 is connected to an input port of PWM conversion circuit 56. The PWM conversion circuit 56, in conventional manner, creates a PWM output signal, hereinafter known as the contingent motor-governing PWM signal, from the value stored in memory 54.

An output port of PWM conversion circuit 56 (at which the contingent motor-governing PWM output signal is applied) is connected to a first input terminal of switch 55. A second input terminal of switch 55 is connected to microprocessor 40 via pulse width modulation (PWM) line 46 for receipt of the normal motor-governing PWM control signal. An output terminal of switch 55 is connected to a PWM input terminal of controller 52. Controller 52 has a switch control output terminal which is connected by switch control line 59 to switch 55 for controlling actuation of switch 55 (i.e., whether the output terminal of switch 55 is connected to receive either the contingent motor-governing PWM output signal or the normal motor-governing PWM control signal). For purposes of the present invention, it shall be assumed that the normal motor-governing PWM control signal is always applied to controller 52. Similarly, although controller 52 is also connected to receive on line 60 a signal which indicates when a power-off condition has occurred (i.e., when power is interrupted from power supply 23), such signal is not involved in the present invention.

At respective input terminals, controller 52 receives the mode_state signal on line 47 and the power_state signal on line 48. Controller 52 is further connected to receive input signals on bus 62 from the unillustrated Hall sensors associated with each of the three coils 24 of motor 22. A data output port of controller 52 is connected by a six bit bus 64 to the gate control circuitry 58 which controls gates of each of the transistors 28. Gate control circuitry 58 has six gate driving output lines 68, with a separate gate driving output line for the gate of each transistor 28.

Amplifier 18 further includes a secondary or regenerative power supply circuit 70 which provides power to the state control circuit during a power-off condition. In the embodiment illustrated in FIG. 1, regenerative power supply circuit 70 comprises the coil drive circuits 26; a bypass capacitor 72; and a diode 74 (which, in the illustrated embodiment, in a Schottky diode). Bypass capacitor 72 is connected on a power supply line 76 between external power supply 23 and each of the coil drive circuits 26; diode 74 is connected between bypass capacitor 72 and external power supply 23. Regenerative power supply circuit 70 provides power on power supply line 76 and power supply branch line 78 to state control circuit 50.

A voltage control gate, particularly FET 80, is connected on line 76 intermediate diode 74 and the coil drive circuits 26. The gate of FET 80 is connected by FET control line 82 to an output terminal of controller 52.

Controller 52 is a state machine with circuitry which receives the pulse width modulated input signals (i.e., those applied on line 46), the signals from the Hall sensors (on line 62), the power_state signal (on line 48), and the mode_state signal on line 47 in connection with conventional commutation processes to output signals on line bus 64 (for governing gate control circuitry 58) and line 82 (for controlling FET 80) in order to achieve the below-described bridge transistor driving scenarios. Given these scenarios, circuit structures for controller 52 and gate control circuitry 58 are well within the keen of the man skilled in the art.

Tape Drive Embodiment

Figure 2:
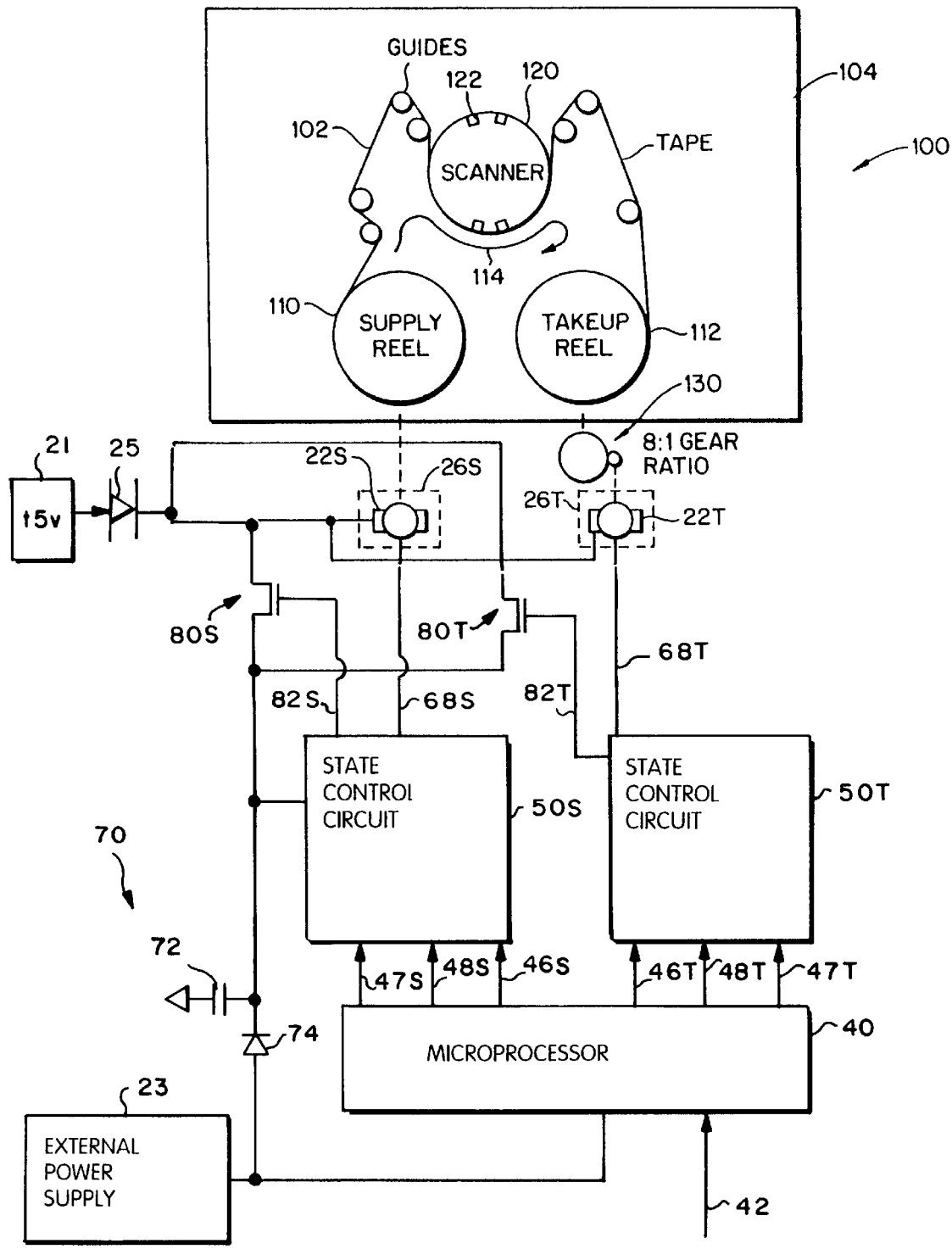
FIG. 2 is a schematic view showing employment of portions of the power amplifier of FIG. 1 in a tape drive system.

FIG. 2 shows implementation of power amplifier 18 of FIG. 1 in a tape drive 100 for recording information signals on a magnetic tape 102 and for reproducing information signals from the tape 102. Unless otherwise specified, like numbered reference numerals utilized in FIG. 1 and FIG. 2 (although perhaps used with alphabetical suffixes in FIG. 2 to distinguish supply side and take-up side) refer to structure having essentially the same constituency and operation.

As shown in FIG. 2, tape drive 100 includes a floor or deck 104 upon which are mounted a supply reel 110 and a take-up reel 112. A tape path 114 extends from supply reel 110 to take-up reel 112. Tape drive 100 further includes a drum or scanner 120 which includes one or more transducing heads 122 which are selectively in contact with a portion of tape 102 as scanner 120 rotates.

Tape drive 100 further comprises a motor 22S for causing rotation of supply reel 110 and motor 22T for causing rotation of take-up reel 112. A gearing arrangement 130 exists between take-up reel 112 and its motor 22T. This gearing arrangement is further described in simultaneously-filed U.S. patent application Ser. No. 08/150,730 of Miles and Zweighaft entitled "Capstanless Helical Drive System" (incorporated herein by reference). Utilization of one geared motor and one ungeared motor is deemed preferable, but not exclusive.

Motors 22S and 22T are schematically illustrated in FIG. 2 as having corresponding coil drive circuits 26S and 26T which are driven by respective state control circuits 50S and 50T. Each of the coil drive circuits 26S, 26T is essentially the coil drive circuit 26 illustrated in FIG. 1. Likewise, state control circuits 50S and 50T are each essentially the motor drive circuit 50 shown in FIG. 1.

FIG. 2 further illustrates that the motors 22S, 22T are each connected to power supply 21 and power supply 23, with FETs 80S and 80T being connected between power supply 23 and motors 22S, 22T, respectively. FETs 80S and 80T are controlled by respective state control circuits 50S, 50T by signals on lines 82S, 82T, respectively.

Although not shown in FIG. 2 for sake of simplicity, it should be understood that each coil drive circuit 26 is connected to ground through a current gate and resistor (such as FET 32 and resistor 34 shown in FIG. 1). Likewise that microprocessor 40 outputs current control signals to current gate feedback control circuits (such as circuit 38 in FIG. 1).

In the embodiment shown in FIG. 2, a single microprocessor 40 outputs differing signals to motor control circuit 50S and motor control circuit 50T. It should be understood that, in other embodiments, a separate microprocessor can be utilized for each motor drive circuit if desired. Moreover, microprocessor 40 of FIG. 2 receives on line 42 signals indicative of situational use for which motor 22 is to be employed. For example, a first situational usage might be a slow speed reading or recording on tape, in which case linear mode is appropriate. When reversing the tape at low speed, linear mode is also appropriate. When transporting tape 22 steadily at high speed (e.g., five times faster than the slowest speed), two quadrant switching mode is appropriate. However, when attempting to decelerate from high speed, four quadrant switching mode is appropriate.

General Operation

Figure 3:
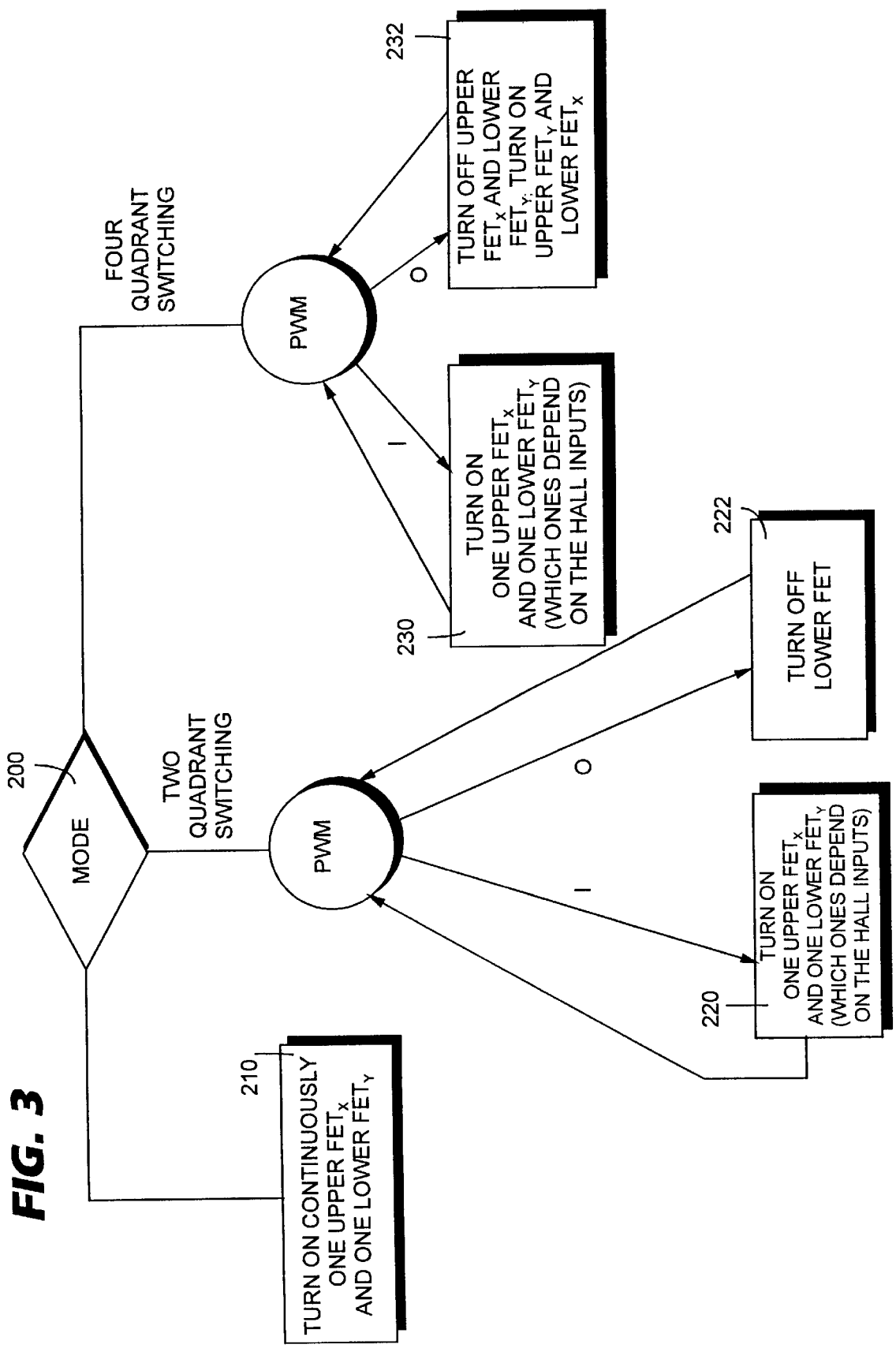
FIG. 3 is a flowchart/state diagram depicting steps involved in the execution of amplification modes of the invention.

Various modes of operation are described with reference to FIG. 3. FIG. 3 shows that after microprocessor 40 receives, on line 42, a signal indicative of a situational usage, at step 200 microprocessor 40 makes a determination as to which of a plurality of modes should be entered. The three modes illustrated are the linear mode, the two quadrant switching mode, and a four quadrant switching mode. Each of these three modes are discussed below, the switching modes being collectively discussed prior to a separate treatment of each.

In connection with the discussion of each mode, it should be understood that microprocessor 40 is also generating a PWM drive signal on line 46. As is well understood in the art, the PWM drive signal is high ("1") during a percentage of its duty cycle and low ("0") during the remainder of its duty cycle. During the high portion of its duty cycle, the signal causes to turn on one or more transistors 30 (which ones depends on the Hall inputs on line 62).

Linear Mode Operation

When a signal on line 42 indicates a situational usage requiring linear mode operation, microprocessor 40 generates a signal on line 49 to feedback circuit 38 for only partially turning on FET 32. Then, in accordance with the PWM signal applied on line 46, controller 52 executes a commutation sequence wherein switching occurs only when the active coil pair needs to be changed to a different pair as the motor rotates. In the embodiment of FIG. 2, this occurs twenty four times per rotation of motor 22.

In accordance with the commutation sequence for the linear mode operation, as shown in step 210 of FIG. 3 only two of the bridge transistors 30 are on (an upper transistor 28U for a first coil and a lower transistor 28U for a second coil), and current flows through these "on" transistors 30 and through the partially-on FET 32 to ground. Thus, at any given time two of the motor coils 24 are conducting and one of the three motor coils 24 is not conducting.

In this linear mode, current level is measured and fedback to feedback control circuit 38. Feedback control circuit 38 in turn adjusts the drive to FET 32, so that the current level in motor 22 is proportional to the drive signal sent back to feedback circuit 38 on line 36. This feedback has the advantage of automatically compensating for a loss in conducting ability (e.g., partial turn-on) of the lower bridge transistors 30L under certain circumstances.

Switching Mode Operation

When a signal on line 42 indicates a situational usage requiring switching mode operation, microprocessor 40 generates a signal on line 49 to feedback circuit 38 for fully turning on FET 32. Then, in accordance with the PWM signal applied on line 46, state control circuit 50 drives the coil drive circuits so that switching occurs not only to execute a commutation sequence, but also to achieve "chopping". The resulting average voltage applied to motor 22 is proportional to the duty cycle of the applied PWM signal. This is distinct from the linear case, where the motor current is proportional to the drive signal.

Power amplifier 18 can execute switching mode operation both in a two quadrant switching mode and a four quadrant switching mode. Each of these further modes are discussed separately below.

Two Quadrant Switching Mode Operation

FIG. 3 shows how the two quadrant switching mode is executed. In particular, steps 220 and 222 of FIG. 3 illustrate how controller 52 and gate control circuitry 58 use the PWM signal to apply signals to gates of the transistors 28 for driving motor 22 in accordance with the determination of microprocessor 40. Exactly which transistors 28 are "on" when the PWM signal so indicates depends on the states of the three Hall signals from motor 22 (on line 62), in accordance with conventional practice.

As indicated by step 220, when the PWM signal is high ("1") the controller 52 and circuitry 58 turn on one upper transistor 28U and one lower transistor 28L (which ones depending on the Hall input signals). For example, transistors $28U_2$ and $28L_3$ might be conducting, with no diodes 30 conducting, and current is flowing from bypass capacitor 72. As indicated by step 222, when the PWM signal is low ("0") the controller 52 and circuitry 58 turn off the lower transistor 28L so that its counterpart upper diode 28L is conducting. Other behavior during the two quadrant switching mode is explained in more detail in simultaneously-filed U.S. patent application Ser. No. 08/150,727 of James Zweighaft entitled "Power-Off Motor Deceleration Control System" (incorporated herein by reference).

Four Quadrant Switching Mode Operation

FIG. 3 shows how the four quadrant switching mode is executed. In particular, steps 230 and 232 of FIG. 3 illustrate how controller 52 and gate control circuitry 58 use the PWM signal to apply signals to gates of the transistors 28 for driving motor 22 in accordance with the determination of microprocessor 40. Again, exactly which transistors 28 are "on" when the PWM signal so indicates depends on the states of the three Hall signals from motor 22 (on line 62), in accordance with conventional practice.

As indicated by step 230 (like step 220) when the PWM signal is high ("1") the controller 52 and circuitry 58 turn on one upper transistor 28U and one lower transistor 28L (which ones depending on the Hall input signals). Again, for example, transistors $28U_2$ and $28L_3$ might be conducting, with no diodes 30 conducting. But, as indicated by step 232, when the PWM signal is low ("0") the controller 52 and circuitry 58 turn off both of the transistors which were on in step 230, and instead turn on the opposite pair (i.e., turn on transistor $28L_2$ and transistor $28U_3$ in the present example). Step 232 has the effect of reversing the voltage seen by coils 24 and forcing the current to decay regardless of the speed of motor 22 within certain limits. Disadvantages of four quadrant switching mode is its increased electronic noise, and an increase in current "ripple" due to the fast decay of current during the "off" cycle.

Power Switching Operation

Power amplifier 18 is also capable of using two different operating voltages. When microprocessor 40 determines that situational usage of motor 22 requires a low speed (e.g., when helical scan recorder 100 is reading data), the power_state signal on line 48 is set so that controller 52 will apply a signal on control line 82 to preclude FET 80 from conducting. In such case, +5 volts from source 21 is applied (via diode 25) to the coil drive circuits 26, thereby keeping power dissipation and electronic noise low.

When microprocessor 40 determines that situational usage of motor 22 requires or permits a high speed (e.g., when helical scan recorder 100 is conducting a fast search operation), the power_state signal on line 48 is set so that controller 52 will apply a signal on control line 82 to enable FET 80 to conduct. When FET 80 conducts, +12 voltage from source 23 is applied on line 76.

While the invention has been particularly shown and described with reference to the preferred embodiments thereof, it will be understood by those skilled in the art that various alterations in form and detail may be made therein without departing from the spirit and scope of the invention. For example, although the coil drive circuits 26 have been shown as including FET transistors 28 with associated intrinsic diodes 30, other analogous components can be utilized in other embodiments. For example, bipolar transistors can also be employed if provided with external diodes to perform the function of the intrinsic diodes 30. The function of the coil drive circuits 26 can also be performed by commercial chips.

The embodiments of the invention in which an exclusive property or privilege is claimed are defined as follows:

1. A tape drive comprising:

a reel for transporting tape in the tape drive;

a brushless DC motor which rotates the reel, the motor having a plurality of commutating coils with a coil drive circuit for each coil;

a power amplifier which operates in a plurality of amplification modes and which drives the brushless DC motor, the power amplifier comprising:

a processor which receives an input signal which dynamically changes in accordance with a change in tape transport operation, in response to the input signal the processor generating a differing value of a mode state signal for differing tape transport operations, the differing values of the mode state signal requiring implementation of corresponding differing ones of a plurality of amplification modes, the amplification modes including linear mode, two quadrant switching mode, and four quadrant switching mode;

a controller which, in response to the mode state signal, generates control signals for each of the coil drive circuits for commutating the coils of the motor;

whereby, in accordance with dynamically changing input signal, the power amplifier changes amplification modes on-the-fly between the linear mode, the two quadrant switching mode and the four quadrant switching mode.

2. The tape drive of claim 1, wherein in response to the signal indicative of a desired tape transport operation, the processor generates a power state signal, and wherein the controller selectively connects the coil drive circuits to a suitable one of a plurality of differing voltage sources in response to the power state signal.

3. The tape drive of 1, wherein the desired tape transport operation is one of a slow speed reading on tape, a slow speed recording on tape, a slow speed reversal of tape, a high speed transport of tape, and a tape deceleration.

* * * * *